(12) United States Patent
Reboa

(10) Patent No.: US 7,309,902 B2
(45) Date of Patent: Dec. 18, 2007

(54) MICROELECTRONIC DEVICE WITH ANTI-STICTION COATING

(75) Inventor: Paul F. Reboa, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 69 days.

(21) Appl. No.: 10/998,290

(22) Filed: Nov. 26, 2004

(65) Prior Publication Data

US 2006/0113618 A1 Jun. 1, 2006

(51) Int. Cl.
*H01L 29/84* (2006.01)
(52) U.S. Cl. ........................ 257/415; 257/417; 257/418; 257/E29.002
(58) Field of Classification Search ................ 257/415, 257/417, 418, E29.002
See application file for complete search history.

(56) References Cited

U.S. PATENT DOCUMENTS

| 6,335,224 | B1 | 1/2002 | Peterson et al. | |
|---|---|---|---|---|
| 6,404,028 | B1 | 6/2002 | Hetrick et al. | |
| 6,707,593 | B2 | 3/2004 | Le et al. | |
| 6,969,635 | B2* | 11/2005 | Patel et al. | 438/107 |
| 2002/0071170 | A1 | 6/2002 | Miller et al. | |
| 2002/0197002 | A1 | 12/2002 | Lin | |
| 2003/0211650 | A1* | 11/2003 | Martin | 438/50 |
| 2004/0012061 | A1* | 1/2004 | Reid et al. | 257/415 |
| 2004/0157426 | A1* | 8/2004 | Ouellet et al. | 438/618 |
| 2005/0118742 | A1* | 6/2005 | Henning et al. | 438/48 |
| 2005/0191789 | A1* | 9/2005 | Patel et al. | 438/107 |
| 2005/0191790 | A1* | 9/2005 | Patel et al. | 438/107 |
| 2005/0214976 | A1* | 9/2005 | Patel et al. | 438/107 |
| 2006/0024880 | A1* | 2/2006 | Chui et al. | 438/222 |
| 2006/0077503 | A1* | 4/2006 | Palmateer et al. | 359/237 |

* cited by examiner

*Primary Examiner*—Ngân V. Ngô

(57) ABSTRACT

One embodiment of a microelectronic device includes a movable plate including a lower surface, a bump positioned on the lower surface, and an anti-stiction coating positioned only on the bump.

25 Claims, 1 Drawing Sheet

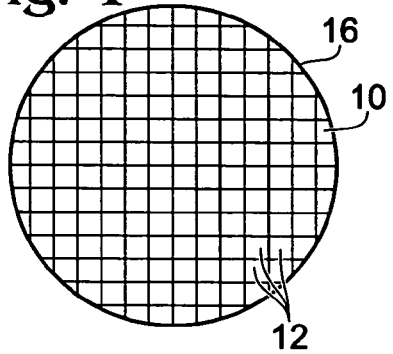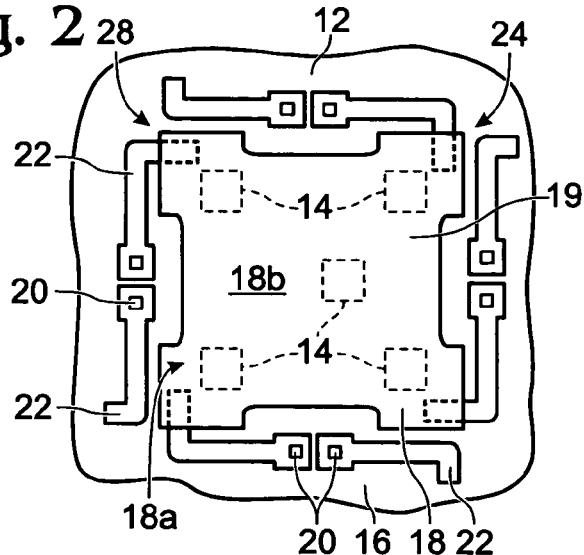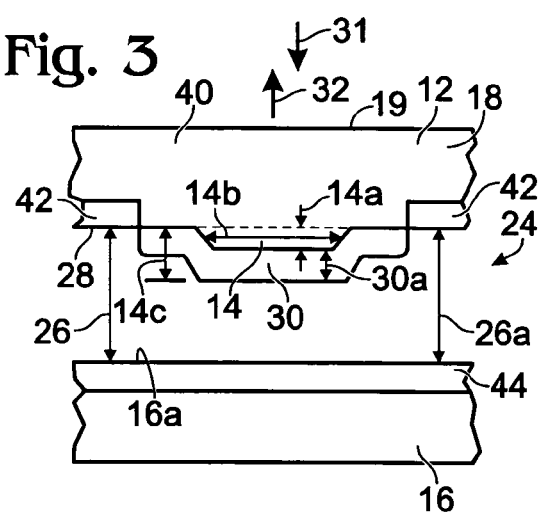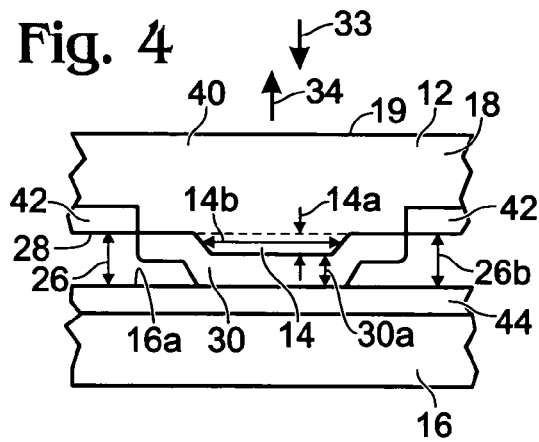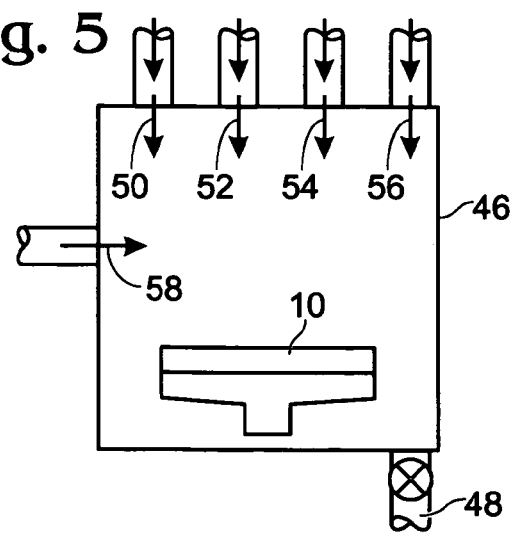

MICROELECTRONIC DEVICE WITH ANTI-STICTION COATING

BACKGROUND

Microelectronic devices, such as microelectromechanical devices (MEMS), may include a movable member, such as a movable reflective plate, positioned on a substrate. The movable member may be positioned just above a surface of the substrate such that a spacing between the movable member and the substrate may be only a few hundred nanometers and may be varied by movement of the movable member. A bump may be positioned between the movable member and the substrate to maintain the spacing during movement of the movable member. Stiction forces may build up on the movable member and/or the bump which may hinder movement of the movable member. The stiction forces may arise from dielectric charge trapping, capillary forces, and/or van de Waals forces. It may be desirable to coat the bump so as to reduce the stiction forces on the bump and/or the movable member.

BRIEF DESCRIPTION OF THE DRAWINGS

FIG. 1 is a schematic top view of one embodiment of a wafer including a plurality of microelectronic devices thereon.

FIG. 2 is a schematic top view of one embodiment of a microelectronic device.

FIGS. 3 and 4 are schematic cross-sectional side views of one embodiment of a microelectronic device, including one embodiment of an anti-stiction device and coating thereon, in an unbiased and a biased condition, respectively.

FIG. 5 is a schematic cross-sectional side view of one embodiment of a process of applying one embodiment of an anti-stiction coating.

DETAILED DESCRIPTION OF THE DRAWINGS

FIG. 1 is a schematic top view of one embodiment of a wafer 10 including a plurality of microelectronic devices 12 thereon. Wafer 10 may be manufactured such that each of microelectronic devices 12 includes one or more bumps or bump regions 14 (see FIG. 3) so as to space each device 12 from a substrate 16. In the exemplary embodiment, devices 12 may each comprise a microelectromechanical device (MEMS) including a movable member, such as a movable reflective plate 18 (see FIG. 2). Movable reflective plate 18 (see FIG. 2) and substrate 16 together may comprise an interferometer, such as an optical Fabry-Perot interferometer. Each of devices 12 may be manufactured simultaneously on wafer 10 so as to reduce manufacturing costs of the devices.

FIG. 2 is a schematic top view of one embodiment of a microelectronic device 12. Device 12 may include movable reflective plate 18 movably mounted on substrate 16 by a plurality of posts 20 and a plurality of flexure members 22 captured by posts 20. Reflective plate 18 may include a top surface 19 that is reflective, a lower surface 28 that is reflective, or top and bottom reflective surfaces. Posts 20 and flexure members 22 may provide a nominal spacing 24 (see FIG. 3) between movable reflective plate 18 and substrate 16 in the absence of an outside force on movable plate 18 and substrate 16. In operation a voltage may be applied between reflective plate 18 and substrate 16 which may cause movable reflective plate 18 to move with respect to substrate 16. Movement of plate 18 may change a height 26 (see FIG. 3) of spacing 24, wherein the voltage force on movable plate 18 may overcome the static force of flexures 22. When the voltage is removed from movable plate 18 and substrate 16, flexure members 22 may restore movable plate 18 back into the nominal position above substrate 16. Flexure members 22 may be substantially evenly spaced around a perimeter of plate 18 such that flexure members 22 may operate to move plate 18 toward and away from substrate 16 while maintaining the plate substantially parallel to the substrate. Flexure member 22 may be manufactured of any flexible material, and in the embodiment shown may be manufactured of tantalum aluminum (TaAl), and posts 20 may be manufactured of TaAl with silicon or silicon nitride dispersed therein Flexure members 22 and posts 20 may be manufactured by deposition and etching processes.

Bumps 14 (shown in dash lines) may be positioned between reflective plate 18 and substrate 16. In the exemplary embodiment, bumps 14 may be positioned on an underside 28 (see FIG. 3) of plate 18. In particular, in the exemplary embodiment, movable plate 18 may include five bumps 14, one in each corner 18a of the movable plate and one positioned in a central region 18b of plate 18. In other embodiments bumps 14 may be positioned on substrate 16 or otherwise positioned between the plate and the substrate such as defining a separate structure. In the embodiment shown, during application of a voltage between plate 18 and substrate 16, the plate and the substrate may not contact one another, but bumps 14 may contact substrate 16. In other words, bumps 14 may define a minimum height 26 of spacing 24 (see FIG. 3). Bumps 14 may be manufactured of a nonconductive material, such as a dielectric, such that contact of bumps 14 with substrate 16 may not result in electrical conductivity between plate 18 and substrate 16.

During contact of bumps 14 with substrate 16 a stiction force may arise between bumps 14 and substrate 16. A stiction force may be defined as the force utilized to cause one body in contact with another body to remain in contact such that the stiction force may be overcome to move one body relative to another. Examples of stiction forces may include dielectric charge trapping, capillary forces, and van der Waals forces. Capillary forces may arise during conditions of high humidity, such as a relative humidity of thirty percent or more. Charge trapping and van der Waals forces may arise at very short distances, such as within the close spacing of movable plate 18 and substrate 16 of a MEMS device. These stiction forces may tend to retain bumps 14 in contact with substrate 16 after the voltage is removed from the plate and the substrate. This continued contact between plate 18 and substrate 16 after removal of the voltage may result in a continued small spacing 24 between plate 18 and substrate 16, which may result in undesirable reflection of light from movable reflective plate 18. In other words, the stiction forces on bumps 14 may result in malfunction of reflective plate 18 in the unbiased condition. Accordingly, it may be desirable to coat bumps 14 with an anti-stiction coating 30 (see FIG. 3) to decrease and overcome the stiction force.

FIG. 3 is a schematic cross-sectional side view of one embodiment of microelectronic device 12, including one embodiment of bump 14 with coating 30 thereon. FIG. 3 shows plate 18 in an unbiased condition, i.e., in a condition where no voltage is applied to plate 18 and substrate 16. In this condition, flexure members 22 (see FIG. 2) may retain spacing 24 between plate 18 and substrate 16 at a height 26 of less than approximately 800 nanometers, wherein height 26 may be in a range of 400 to 600 nanometers, for example. In the embodiment wherein substrate 16 may include a reflective surface 16a, this nominal or unbiased height 26 of spacing 24 may position plate 18 with respect to substrate 16 such that spacing 24 defines a first interference distance 26a that may result in an incoming light 31 being transmitted or filtered as a first light 32 from device 12. First light 32 may be a particular color of light such as green, red or blue, or may be a full spectrum of light, such as white light.

FIG. 4 shows plate 18 in a biased condition, i.e., in a condition where a voltage is applied to plate 18 and substrate 16. In this condition, a force of flexure members 22 (see FIG. 2) may be overcome by the applied voltage such that plate 18 and substrate 16 may be spaced by a height 26 of less than approximately 50 nanometers. In the embodiment wherein substrate 16 may include a reflective surface 16a, this biased height 26 of spacing 24 may position plate 18 with respect to substrate 16 such that spacing 24 defines a second interference distance 26b that may result in an incoming light 33 being transmitted for filtered as a second light 34 from device 12. Second light 34 may be an image or a colored light having a high resolution due to the interference fringes created by the position of plate 18 with respect to substrate 16. Second light 34 may be a particular color of light, wherein the color may be defined by the height 26b of spacing 24. As height 26b is varied, light 34 may be varied. In a completely lowered position of plate 18, wherein height 26b is approximately the same as height 14c of bump 14 and coating 30, such as approximately 50 nanometers, light 34 may be substantially an absence of light, i.e., a black state. Accordingly, in a completely lowered position, plate 18 may be in an "off" condition. The plate 18 may be referred to as being in the "on" position in all positions but the fully lowered position. In one embodiment, wherein height 14c of bump 14 and coating 30 is 50 nanometers, and height 26a is 450 nanometers, the travel distance of plate 18 is approximately 400 nanometers, which may provide green light from plate 18.

Still referring to FIG. 4, bump 14 is shown in contact with or very close to substrate 16. Bump 14 may have a height 14a of at most approximately 50 nanometers, and approximately less than 40 nanometers, and a width 14b of approximately 200 nanometers. Bump 14 is shown having anti-stiction coating 30 thereon, wherein coating 30 may have a height 30a (shown larger than scale for ease of illustration) of approximately 1.5 nanometers (15 Angstroms), and may be in a range of approximately 10 to 15 Angstroms or less. Accordingly, bump 14 with coating 30 thereon may have a height 14c of at most approximately 60 nanometers. Anti-stiction coating 30 acts to reduce the effect of stiction forces on bump 14 such that when a voltage is removed from plate 18 and substrate 16, bump 14 easily moves away from substrate 16 by the force of flexure members 22 (see FIG. 2). Coating 30 may be positioned only in bump region 14 but not in a remainder of underside 28 of movable plate 18, as will be described below.

Referring to FIGS. 3 and 4, in the embodiment shown, plate 18 includes a first region 40, including bump 14, manufactured of an oxide material such as a dielectric insulator, namely, silicon oxide. Bumps 14 may be manufactured on underside 28 of plate 18 by a process of etching, or any other process as may be desired. Plate 18 also includes a second region 42, that may define lower surface 28, manufactured of a conductive material, such as tantalum aluminum (TaAl). In another embodiment, second region 42 may be manufactured of aluminum copper (AlCu). Second region 42 may extend over substantially the entire surface of lower surface 28, except for bump regions 14. Similarly, substrate 16 may include a region 44 in an upper region of the substrate that may be manufactured of a conductive material, such as TaAl or AlCu. A voltage may be applied to plate 18 and substrate 16 by application of a voltage to second region 42 of plate 18 and to region 44 of substrate 16. For example, in one embodiment, a voltage of approximately 6 volts is applied across plate 18 and substrate 16 to induce a desired spacing 26b therebetween, wherein spacing 26b may provide a desired interferometer spacing of plate 18 and substrate 16 so as to provide a desired color of light from movable plate 18.

FIG. 5 is a schematic cross-sectional side view of one embodiment of a process of applying one embodiment of anti-stiction coating 30 to bump regions 14. In this embodiment, coating 30 (see FIG. 3) is applied by vapor deposition in an enclosed deposition chamber 46 with the use of a vacuum pump 48 to reduce the total pressure within chamber 46. In one embodiment, vapor deposition is initiated when the pressure within chamber 46 is approximately 100 millitorr. A total partial pressure of approximately 100 to 900 millitorr of a precursor material, such as silane 50, may be introduced to chamber 46 and wafer 10 positioned therein. Immediately after addition of the silane 50, a catalyst, such as an approximately equal amount of either water vapor or acetic acid vapor 52 may be introduced to chamber 46. The silane 50, as catalyzed by the water or acetic acid 52, reacts selectively with the dielectric material of bump regions 14 on wafer 10, i.e., the precursor 50 is non-reactive with the conductive or metallic material of second region 42 of plate 18. In particular, the Si—Cl or the Si(OCH3) bond is broken, with the subsequent reaction of water condensation to form a Si—O—Si (surface) bond. The reaction is allowed to go to completion at a temperature of approximately 35 to 45 degrees Celsius for approximately twenty minutes, and more particularly, approximately less than fifteen minutes. Deposition chamber 46 may then be evacuated to remove any residual hydrochloric acid, alcohol or water and any unreacted reactants from the chamber. Chamber 46 may then be flushed with an inert gas, such as nitrogen 54, and opened to the atmosphere. Wafer 10 within chamber 46 may then be heated at approximately less than one hundred and twenty degrees Celsius, and more particularly, at approximately one hundred and ten degrees Celsius, for greater than forty minutes and less than one hundred minutes, and more particularly, for approximately one hour, to align the molecules properly on the surface of bump regions 14 to form self-assembled monolayers of coating 30. "Self-assembled monolayers" may be described, in one example, as the molecules arranging themselves such that the fluorinated tail end of the carbon chains align themselves as far away from the substrate surface as possible such that the carbon chains are positioned substantially perpendicular to the surface of the substrate. Alternatively, alignment may be allowed to occur at ambient temperature over several days.

Coating 30 may comprise a hydrocarbon, such as a fluorinated long-chain silane which may readily react with the dielectric bump regions 14 of plate 18, but not with the metallic conductive regions 42 of plate 18. Accordingly, coating 30 may be manufactured of a material that selectively coats bump regions 14 while not coating a remainder of plate 18. In general, coating 30 may be reacted from a precursor 50, such as a fluorinated silane, and a catalyst 52. In particular, precursor 50 may be fluorinated octyltrichlorosilane (FOTS), fluorinated decyltrichlorosilane (FDTS), dichlorodimethylsilane (DDMS), octyltrichlorosilane (OTS) octadecyltrichlorosilane (ODTS), perfluorobenzoic acid and perfluorooctanoic acid. Catalyst 52 may be water or acetic acid. The coating material generated may be hydrophobic and may provide protection against humidity controlled attractive capillary forces that may tend to adhere bump regions 14 to substrate 16. Coating 30 may act as a lubricant that may prevent humidity from accumulating on bump 14 by forming a conformal coating, such as with DDMS, or by forming self-assembled monolayers (SAMS), such as with FOTS, FDTS, OTS and ODTS. When the silane utilized is fluorinated, there may also be repulsive forces between coating 30 and a water condensate in spacing 24 because the fluorines may repel each other. Each of FOTS, FDTS, DDMS, OTS and ODTS may be reacted in chamber 46 as the alkoxy, wherein each chloride may be substituted by a —OCH3 or —OCH2CH3 group. However, the alkoxysilanes may not be as reactive as other compounds and may utilize longer reaction times or higher temperatures for the reaction to be completed. Additionally, the alkoxysilanes may utilize both water and acetic acid simultaneously as a catalyst. After deposition of coating 30, the individual devices 12 may be separated, by cutting wafer 10, and then individually packaged.

The vapor deposition process may further include one or more pretreatment steps. In a first pretreatment step, the density of the reacted silane of coating 30 may be augmented by use of a pretreatment material 56, such as a water plasma or an oxygen plasma pretreatment material. During this cleaning and activation pretreatment step, bump regions 14 of wafer 10 may be exposed to the water plasma or oxygen plasma 56 for a time period of approximately five minutes at an ambient temperature and a flow rate of approximately 100 standard cubic centimeters per minute (sccm) at a power of approximately 200 Watts. Both pretreatment materials listed may generate more silanol (SiOH) groups on the surface of bump regions 14 which may then be reacted with the trichlorosilanes listed above. The greater surface density of the reacted silanes on the surface of coating 30 may render the coating more hydrophobic and thus more protected against stiction forces.

The vapor deposition process described above is relatively quick, reproducible and economical. The amount of material deposited as coating 30 may be relatively small because only a monolayer may be utilized and because the coating is selectively deposited only on bump regions 14 of plate 18. When FOTS is utilized as the coating material, a monolayer of less than twenty Angstroms thick, and more particularly, about 12 Angstroms thick, may be sufficient to provide anti-stiction properties to bump regions 14. Providing a relatively thin coating 30 may be desired because full travel of plate 18 with respect to substrate 16 may permit full functioning of the movable plate, i.e., the ability of the plate of reach a substantially full black state by movement of the plate toward substrate 16.

In another embodiment, coating 30 may be applied as a liquid solution wherein wafer 10 is coated with the solution. The wafer is then removed from the liquid solution and dried. This method of application may result in capillary forces between movable plate 18 and substrate 16 due to the use of a liquid solution. The thickness of coating 30 may be difficult to control when the coating is applied in condensed phases and the amount of material supplied may be difficult to accurately measure. In addition, during liquid solution deposition, undesirable particles may be deposited. Accordingly, the vapor deposition method discussed above may be more reliable, more cost effective and more efficient. In still another embodiment, the anti-stiction coating material may be placed within the MEMs packaging. The anti-stiction coating material may then be activated to coat only the bump regions 14 after the MEMs device 12 is sealed within its individual package.

In other embodiments a deposition process may be utilized wherein a single device 12 is individually coated wherein coating 30 selectively coats only bump regions 14 and not a remainder of device 12. However, simultaneously coating each of bump regions 14 on an entire wafer 10 may be more efficient.

Another pretreatment step may also be conducted. In this pretreatment step MEMs device 12 may be treated with a carboxylic acid 58, such as benzoic acid, perfluorobenzoic acid, lauric acid, or perfluorooctanoic acid, in vapor form. The pretreatment may be conducted under vacuum in deposition chamber 46 at a temperature in a range of 35 to 45 degrees Celsius, with a pressure of carboxylic acid 58 of approximately 200 to 700 millitorr for a time period of approximately ten to fifteen minutes. Carboxylic acid 58 may attach itself to aluminum and/or aluminum oxides on the TaAl surfaces of wafer 10, such as second region 42 of plate 18 and region 44 of substrate 16 of devices 12. The carboxylic acid 58 may not react with the oxide of bump regions 14, such as the TEOS material. This carboxylic acid pretreatment step is thought to chelate the aluminum sites on the surface of the TaAl layer which may reduce or eliminate the anti-stiction coating from being deposited on the non-bump regions 14 of device 12. Accordingly, this pretreatment step facilitates deposition of anti-stiction coating 30 on only bump regions 14 of device 12. This carboxylic acid pretreatment step may also increase shunting of electrical charge on the surface of the deposited carboxylic acid to the conductive surfaces, such as second region 42 of plate 18 and region 44 of substrate 16, thereby reducing charge trapping stiction forces on device 12. After the carboxylic acid pretreatment step, wafer 10 may undergo deposition of anti-stiction coating 30, as described above, which may be selectively deposited only on bump regions 14.

Other variations and modifications of the concepts described herein may be utilized and fall within the scope of the claims below.

I claim:

1. A microelectronic device, comprising:
a movable plate including a lower surface;
a bump positioned on said lower surface; and
an anti-stiction coating positioned only on said bump.

2. The device of claim 1 wherein said microelectronic device comprises a microelectrical mechanical device.

3. The device of claim 1 wherein said anti-stiction coating is deposited on said bump by vapor deposition.

4. The device of claim 1 wherein said anti-stiction coating is a fluorinated long-chain silane.

5. The device of claim 1 wherein said bump is manufactured of a dielectric material.

6. The device of claim 1 wherein said bump is manufactured of silicon dioxide.

7. The device of claim 1 wherein said anti-stiction coating is manufactured of a precursor chosen from one of fluorinated octyltrichlorosilane (FOTS), fluorinated decyltrichlorosilane (FDTS), dichlorodimethylsilane (DDMS), octyltrichlorosilane (OTS) and octadecyltrichlorosilane (ODTS).

8. The device of claim 1 wherein said anti-stiction coating is hydrophobic.

9. The device of claim 1 wherein said device comprises a Fabry-Perot interferometer.

10. The device of claim 1 further comprising a substrate, wherein said plate is movably mounted on said substrate and said bump moves into and out of contact with said substrate during movement of said plate.

11. The device of claim 1 wherein said bump extends outwardly from said lower surface a distance of at most 60 nanometers.

12. A microelectronic device, comprising:

a substrate;

a plate movably positioned on said substrate, said movable plate including at least one anti-stiction bump region; and a fluorinated hydrocarbon coating positioned only on said anti-stiction bump region of said device.

13. The device of claim 12 wherein said device comprises an optical interferometer.

14. The device of claim 12 wherein said plate comprises a reflective pixel plate.

15. The device of claim 12 wherein said movable plate includes a surface facing toward said substrate and wherein said bump region is positioned on said surface.

16. The device of claim 12 wherein said movable plate includes four corner regions and a central region, and wherein said movable plate includes a bump region in each of said four corner regions and said central region.

17. The device of claim 12 wherein said bump region includes a dielectric coating, and wherein said fluorinated hydrocarbon coating is positioned on said dielectric coating.

18. The device of claim 12 wherein said substrate and said movable plate are separated by a distance of at most 500 nanometers.

19. The device of claim 12 further comprising:

a plurality of plates movably positioned on said substrate, each of said movable plates including at least one anti-stiction bump region; and a fluorinated hydrocarbon coating positioned only on said anti-stiction bump regions of said device.

20. The device of claim 12 wherein said fluorinated hydrocarbon coating is manufactured from a precursor chosen from one of fluorinated octyltrichlorosilane (FOTS), fluorinated decyltrichiorosilane (FDTS), perfluorobenzoic acid and perfluorooctanoic acid.

21. A microelectronic device, comprising:

a microelectronic substrate;

a reflective plate movably positioned on said substrate; and an anti-stiction bump positioned on one of said substrate and said plate, said bump including a hydrophobic coating positioned only on said bump.

22. The device of claim 21 wherein said hydrophobic coating comprises a fluorinated hydrocarbon.

23. The device of claim 21 wherein said hydrophobic coating comprises a fluorinated long-chain silane.

24. The device of claim 21 wherein said substrate includes a plurality of reflective plates positioned thereon, each reflective plate including at least one anti-stiction bump having a hydrophobic coating positioned thereon.

25. The device of claim 1 wherein said movable plate includes a conductive surface having a coating thereon of carboxylic acid.

* * * * *

UNITED STATES PATENT AND TRADEMARK OFFICE
CERTIFICATE OF CORRECTION

PATENT NO. : 7,309,902 B2 Page 1 of 1
APPLICATION NO. : 10/998290
DATED : December 18, 2007
INVENTOR(S) : Paul F. Reboa It is certified that error appears in the above-identified patent and that said Letters Patent is hereby corrected as shown below:

In column 8, line 6, in Claim 20, delete "decyltrichiorosilane" and insert -- decyltrichlorosilane --, therefor.

Signed and Sealed this

Eleventh Day of November, 2008

JON W. DUDAS
*Director of the United States Patent and Trademark Office*